(12) United States Patent
Suzuki et al.

(10) Patent No.: US 7,592,125 B2
(45) Date of Patent: Sep. 22, 2009

(54) PHOTORESIST COMPOSITIONS COMPRISING RESIN BLENDS

(75) Inventors: Yasuhiro Suzuki, Cambridge, MA (US); Cheng-Bai Xu, Southboro, MA (US)

(73) Assignee: Rohm and Haas Electric Materials LLC, Marlborough, MA (US)

( * ) Notice: Subject to any disclaimer, the term of this patent is extended or adjusted under 35 U.S.C. 154(b) by 114 days.

(21) Appl. No.: 11/334,939

(22) Filed: Jan. 19, 2006

(65) Prior Publication Data

US 2006/0160022 A1 Jul. 20, 2006

Related U.S. Application Data (60) Provisional application No. 60/645,471, filed on Jan. 19, 2005.

(51) Int. Cl.
*G03F 7/004* (2006.01)
*G03F 7/30* (2006.01)

(52) U.S. Cl. .................... 430/270.1; 430/326; 430/905; 430/910

(58) Field of Classification Search .............. 430/270.1, 430/905, 326, 910
See application file for complete search history.

(56) References Cited

U.S. PATENT DOCUMENTS

| | | | | |
|---|---|---|---|---|
| 5,942,367 A | * | 8/1999 | Watanabe et al. | 430/170 |
| 6,027,854 A | * | 2/2000 | Nishi et al. | 430/270.1 |
| 6,136,502 A | * | 10/2000 | Satoshi et al. | 430/270.1 |
| 6,156,477 A | * | 12/2000 | Motomi et al. | 430/270.1 |
| 6,312,869 B1 | * | 11/2001 | Watanabe et al. | 430/270.1 |
| 6,335,141 B1 | * | 1/2002 | Watanabe et al. | 430/270.1 |
| 7,244,542 B2 | | 7/2007 | Bae et al. | |
| 2002/0012869 A1 | | 1/2002 | Adams et al. | |
| 2004/0038150 A1 | | 2/2004 | Bae et al. | 430/270.1 |

FOREIGN PATENT DOCUMENTS

| | | |
|---|---|---|
| EP | 0 908 473 | 4/1999 |
| EP | 0 908 783 | 4/1999 |
| EP | 0 930 541 | 7/1999 |
| EP | 1 099 983 | 5/2001 |
| EP | 1 182 506 | 2/2002 |

* cited by examiner

*Primary Examiner*—John S Chu
(74) *Attorney, Agent, or Firm*—Peter F. Corless; Darryl P. Frickey; Edwards Angell Palmer & Dodge LLP (57) ABSTRACT

New positive photoresist compositions are provided that contain a photoactive component and blend of at least two distinct resins: i) a first resin that comprises carbocyclic aryl units with hetero substitution (particularly hydroxy or thio) and ii) a second cross-linked resin. Preferred photoresists of the invention can be imaged at short wavelengths, such as sub-200 nm, particularly 193 nm.

15 Claims, 1 Drawing Sheet

PHOTORESIST COMPOSITIONS COMPRISING RESIN BLENDS

BACKGROUND OF THE INVENTION

1. Field of the Invention

The present invention relates to new chemically-amplified positive photoresist compositions that contain a photoactive component and a blend of at least two distinct resins: i) a first resin that comprises carbocyclic aryl units with hetero substitution (particularly hydroxy or thio) and ii) a second cross-linked resin. Preferred photoresists of the invention can be imaged at short wavelengths, such as sub-200 nm, particularly 193 nm.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photo-induced chemical transformation of the photoresist coating to thereby transfer the pattern of the photomask to the photoresist-coated substrate. Following exposure, the photoresist is developed to provide a relief image that permits selective processing of a substrate. See Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4.

Interest has increased in photoresists that can be photoimaged with short wavelength radiation, including exposure radiation of less than 200 nm, such as wavelengths of about 193 nm. Use of such short exposure wavelengths can enable formation of smaller features. Accordingly, a photoresist that yields well-resolved images upon 193 nm exposure could enable formation of extremely small (e.g. sub-0.25 µm) features that respond to constant industry demands for smaller dimension circuit patterns, e.g. to provide greater circuit density and enhanced device performance.

New photoresist components such as resins and photoacid generators have been investigated to improve lithographic performance. See, for instance, U.S. Patent Publications 2002/0012869 and 2004/0038150, which disclose highly useful photoresists.

Nevertheless, efforts continue to improve lithographic properties of photoresists, including for high performance applications such as to print features having dimensions less than 0.2 or 0.1 microns. In such high performance applications, problems may occur such as undesired line edge roughness of the developed resist image and limited depth of focus problems, among others. See, e.g., U.S. Patent Publication 2004/0053511.

It thus would be desirable to have new photoresist compositions. It would be particularly desirable to have new photoresist compositions that could provide good resolution in high performance applications, such as to form imaged resist features having dimensions of about 0.2 microns or less.

SUMMARY OF THE INVENTION

The present invention relates to new chemically-amplified positive photoresist compositions that contain a photoactive component and blend of at least two distinct resins: i) a first resin that comprises carbocyclic aryl units with hetero substitution and ii) a second cross-linked resin.

We have surprisingly found that preferred photoresists of the invention can exhibit notably improved lithographic results, including reduced line edge roughness. See, for instance, the results set forth in Example 16 which follows.

Preferably one or both of the first and second resins of the invention are at least substantially free of aromatic groups other than the hetero-substituted carbocyclic aryl groups. Photoresists of the invention are preferably imaged at wavelengths less than 200 nm, particularly 193 nm.

Preferred first resins of blends and photoresists of the invention comprise hydroxy-substituted carbocyclic aryl groups, particularly hydroxy naphthyl groups. Preferred second resins of blends and photoresists of the invention are crosslinked e.g. by direct linking of polymer chains, or by use of a separate crosslinking component that can link multiple polymer sites or chains.

Resins of the invention may suitably comprise additional repeat units, particularly non-aromatic units such as provided by polymerization of an acrylate or an optionally substituted cyclic olefin (particularly carbon alicyclic or heteroalicyclic group) such as a polymerized optionally substituted norbornene. Preferably, for resins used in positive-acting resists, at least one of the first and second resins may contain one or more photoacid-labile moieties such as a photoacid-labile ester or acetal moiety. Particularly preferred resins are substantially free of any aromatic moieties other than the hydroxy naphthyl groups or other hetero-substituted carbocyclic aryl groups.

Additional preferred polymer units may be provided by polymerization of an anhydride such as maleic anhydride or itaconic anhydride; or lactones such as a gama-butyrolactone, e.g. as may be provided by polymerization of a suitable acrylate e.g. acryloxy-norbornane-butyrolactone and the like.

Photoresists of the invention will comprise a photoactive component, which may comprise one or more photoacid generator compounds (PAGs). Preferred PAGs for use in resists of the invention include onium salt compounds including iodonium and sulfonium compounds; and non-ionic PAGs such as imidosulfonate compounds, N-sulfonyloxyimide compounds; diazosulfonyl compounds and other sulfone PAGS including α,α-methylenedisulfones, disulfonehydrazines and disulfonylamine salts; nitrobenzyl compounds, halogenated particularly fluorinated non-ionic PAGS.

The invention also includes methods for forming relief images, including methods for forming a highly resolved relief image such as a pattern of lines (dense or isolated) where each line has vertical or essentially vertical sidewalls and a line width of about 0.40 microns or less, or even about 0.25, 0.20, 0.15, or 0.10 microns or less. In such methods, preferably a coating layer of a resist of the invention is imaged with short-wavelength radiation, particularly sub-200 nm radiation, especially 193 nm radiation. The invention further comprises articles of manufacture comprising substrates such as a microelectronic wafer having coated thereon the photoresists and relief images of the invention. The invention also provides methods for manufacturing such articles. In further aspects, the invention provides blends of resins as disclosed herein.

Other aspects of the invention are discussed infra.

DETAILED DESCRIPTION OF THE INVENTION

As discussed above, we now provide new positive photoresist compositions that comprise 1) a photoactive component; and 2) a resin component comprises i) a first resin that comprises hetero-substituted carbocyclic aryl groups and ii) a second resin distinct from the first resin and that comprises crosslinked groups or polymer chains or segments. Preferably, both or at least one of the first and second resins are substantially free of aromatic groups other than the hetero-substituted carbocyclic aryl groups.

First Resin Blend Member:

As discussed above, the first resin of the blends and resists of the invention comprise hetero-substituted (particularly hydroxy and thio) carbocyclic aryl moieties such as hydroxy naphthyl groups.

References herein to a hetero-substituted carbocyclic aryl group means that the carbocyclic group has one or more, typically one, two or three, ring substituents that contain a hetero atom, particularly oxygen or sulfur. That is, such references to "hetero-substituted" designate moieties that contain one or more hetero atoms, particularly one or two oxygen and/or sulfur atoms, that are ring substituents of the carbocyclic aryl group.

References herein to hydroxy naphthyl groups or other similar term means a naphthyl group that has at least one hydroxy ring substituent. The naphthyl group may suitably have more than one hydroxy group, such as two or three hydroxy ring substituents, although it is generally preferred that the naphthyl group contain a single hydroxy substituent.

Preferred substituted carbocyclic aryl units for incorporation into a resin are naphthyl groups substituted with one or more hydroxy (—OH), thio (—SH), alcohol (e.g. hydroxy$C_{1-6}$ alkyl), thioalkyl (e.g. $HSC_{1-6}$alkyl), alkanoyl (e.g. $C_{1-6}$alkanoyl such as formyl or acyl), alkylsulfide such as $C_{1-6}$alkylsulfide, carboxylate (including $C_{1-12}$ester), alkyl ether including $C_{1-8}$ether, and the like. Preferably, at least one hetero atom of the hetero-containing substituent has a hydrogen substituent (e.g. hydroxy is preferred over alkoxy). It is also preferred that the hetero group has the hetero atom directly linked to the carbocyclic ring (such as a hydroxy or thio ring substituents), or a hetero atom is a substituent of an activated carbon such as a ring substituent of —$CH_2OH$ or —$CH_2SH$, or other primary hydroxy or thio alkyl.

A resin may suitably contain a relatively wide range of amounts of hydroxy naphthyl units or other hetero-substituted carbocyclic aryl groups. Enhanced lithographic results can be realized with use of a resin that contains quite minor amounts of the hydroxy naphthyl units. For example, a resin may suitably contain less than about 50 or 40 mole percent of hetero-substituted carbocyclic aryl units based on total units of a resin, or even less than about 30, 20, 15 or 10 mole percent of hetero-substituted carbocyclic aryl units based on total units of the polymer. Indeed, a resin may suitably contain about 0.5, 1, 2, 3, 4, 5, 6, 7 or 8 mole percent of hydroxy naphthyl units based on total units of the resin. Typically, a resin will contain at least about 1, 2, 3, 4 or 5 mole percent of hetero-substituted carbocyclic aryl units such as hydroxy naphthyl units based on total resin units. Generally preferred are resins that contain at least or up to about 10, 20, 30, 40, or 45 hetero-substituted carbocyclic aryl units such as hydroxy naphthyl units based on total resin units.

As discussed above, a resin of the invention may comprise a variety of other units in addition to hetero-substituted carbocyclic aryl units. Preferred additional units include polymerized acrylate and cyclic olefin groups.

Preferred polymerized cyclic olefin groups include those that comprise a carbon alicyclic or heteroalicyclic group either pendant or often preferably fused to the resin backbone.

Such a preferred carbon alicyclic group (i.e. the group has all carbon ring members) that is fused to the polymer backbone has at least two carbon alicyclic ring members (typically two adjacent carbon ring atoms) that comprise the polymer backbone. Preferred carbon alicyclic groups are provided by polymerization of cyclic olefin (endocyclic double bond) compounds such as optionally substituted norbornene groups. Other suitable carbon alicyclic groups may be provided by polymerization of a vinyl adamantyl or isobornyl group or the like.

Such a preferred heteroalicyclic group (i.e. nonaromatic and has at least one ring N, O or S atom, preferably one or two O or S atoms) that is fused to the resin backbone has at least two heteroalicyclic ring atoms (typically two adjacent ring atoms) as part of the resin backbone. Suitable heroalicyclic monomers that may be polymerized to form a first resin of the invention are specified below. Such heteroalicyclic groups also are identified in U.S. Pat. No. 6,680,159 to Barclay et al.

Second Resin Blend Member:

Second resins of blends and resists of the invention contain one or more functional groups that provide crosslinking between polymer chains or sites. For instance, polymers of the invention may include one or more groups, in cross-linked form, of alcohols, aldehydes, esters, alkenyl groups, ketones, amines, thiols, sulfides and the like to enable crosslinking between polymer chains. Those groups in crosslinked form should be clear to those skilled in the art. For example, hydroxy groups may be present as ethers, esters or the like. Sulfides may be present as thioethers. Amines may be present as higher order amines, e.g. as a tertiary amine.

Thus, when a second resin is formulated in a photoresist composition, it is in crosslinked form, i.e. where two extended (e.g. at least greater than 30, 40 or 50 repeat units, more typically greater than 100, 200 or 300 repeat units) polymer chains that each have the same or similar repeat units are linked directly or though a linkage (e.g., a linkage of 1, 2 to about 5, 10, 15, 20, 25 or 30 atoms or more) to form a covalent linkage between the two chains.

Crosslinking may be provided by direct linking of two polymer sites or chains, or by use of a separate crosslinking component that can link multiple polymer sites or chains.

For instance, suitable crosslinker components include homo- and heterobifunctional crosslinking agents, such as unsaturated compounds e.g. aldehydes and other carbonyl compounds, and compounds containing one or more carbon-carbon double bonds. More particularly, preferred crosslinker components include vinyl ethers and bis-maleimide compounds. Specifically preferred are vinyl ether compounds, particularly bis-vinyl ether cross-linkers such as 1,4-butanedivinyl ether, 1,6-hexanedivinyl ether, 1,4-cyclohexane dimethanoldivinyl ether, bis-vinylether-ethane ether and the like. Such vinyl ethers are suitably employed to link polymers that have hydroxy or carboxy moieties, such as polymers that contain phenolic units.

Second resins of blends of the invention may comprise units in addition to crosslinked groups and acid labile groups. For example, second resins of blends of the invention may contain units that may be reactive to crosslinking, but are present without linkage to other polymer chains. Additionally, a polymer of the invention may contain adamantyl or other alicyclic groups as may be provided by reaction of a cyclic olefin (norbornene compound) or alicyclic acrylate as adamantyl acrylate, acid units such as may be provided by reaction of acrylic acid, methacrylic acid, and the like. Other preferred polymer units include nitrile units such as may be provided by reaction of acrylonitrile and methacrylonitrile, or by a polymerized alicyclic group that has cyano substitution e.g. a polymerized adamantly acrylate that has cyano substitution of the adamantly ring.

Resin Component (Both First and Second Resins):

As discussed above, preferably at least one of the first and second resins comprises photoacid-labile groups such as photoacid-labile ester or acetal groups which can provide sufficient solubility differentials between exposed and unexposed regions of a resist coating layer. For example, a resin may suitably contain polymerized tert-butyl acrylate, tert-butyl methacrylate, methyladmantyl acrylate, and/or methyladamantyl methacrylate units, and the like. Unless otherwise specified, references herein to acrylate groups or compounds are inclusive of substituted acrylate compounds such as methacrylate compounds.

For both the first and second resins, preferred polymerized acrylate groups may include an alicyclic group. As referred to herein, the term "alicyclic leaving group" of a resin means the following: an alicyclic group that is covalently bound to a polymer, and when such a polymer is formulated in a photoresist containing the polymer and a photoactive component (particularly one or more photoacid generators), the alicyclic group can be or is cleaved from the polymer (i.e. covalent bond to the polymer cleaved) upon exposure to acid generated upon exposure of a coating layer of the photoresist to activating radiation (e.g. 193 nm), typically with post-exposure thermal treatment (e.g. 90° C., 100° C. or 110° C. for 0.5, 1 or more minutes).

An alicyclic acrylate compound contains a vinyl ester, where the ester moiety is an alicyclic group such as methyl adamantyl and the like. The vinyl group suitably may be substituted, particularly at the alpha-vinyl carbon such as by $C_1$-8alkyl and thus includes methacrylates.

For use in positive-acting photoresists, first and second resins that contain photoacid-labile ester groups are often preferred such as a tert-butyl ester, or an ester containing a tertiary alicyclic group. Such photoacid-labile esters may be directly pendant from a carbon alicyclic, heteroalicyclic or other polymer unit (e.g. where the photoacid-labile group is of the formula —C(=O)OR, where R is tert-butyl or other non-cyclic alkyl group, or a tertiary alicyclic group and is directly linked to the polymer unit), or the ester moieties may be spaced from the from a heteroalicyclic or carbon alicyclic polymer unit, e.g. by an optionally alkylene linkage (e.g. —(CH$_2$)$_{1-8}$C(=O)OR, where R is tert-butyl or other non-cyclic alkyl group, or a tertiary alicyclic group).

Preferred tertiary alicyclic hydrocarbon ester photoacid-labile moieties are polycyclic groups such adamantyl, ethylfencyl or a tricyclo decanyl moiety. References herein to a "tertiary alicyclic ester group" or other similar term indicate that a tertiary alicyclic ring carbon is covalently linked to the ester oxygen, i.e. —C(=O)O-TR' where T is a tertiary ring carbon of alicyclic group R'. In at least many cases, preferably a tertiary ring carbon of the alicyclic moiety will be covalently linked to the ester oxygen, such as exemplified by the below-depicted specifically preferred polymers. However, the tertiary carbon linked to the ester oxygen also can be exocyclic to the alicyclic ring, typically where the alicyclic ring is one of the substituents of the exocyclic tertiary carbon. Typically, the tertiary carbon linked to the ester oxygen will be substituted by the alicyclic ring itself, and/or one, two or three alkyl groups having 1 to about 12 carbons, more typically 1 to about 8 carbons, even more typically 1, 2, 3 or 4 carbons. The alicyclic group also preferably will not contain aromatic substitution. The alicyclic groups may be suitably monocyclic, or polycyclic, particularly bicyclic or tricyclic groups.

Preferred alicyclic moieties (e.g. group TR' of —C(=O)O-TR') of photoacid labile ester groups of polymers of the invention have rather large volume. It has been found that such bulky alicyclic groups can provide enhanced resolution when used in copolymers of the invention.

More particularly, preferred alicyclic groups of photoacid labile ester groups will have a molecular volume of at least about 125 or about 130 Å$^3$, more preferably a molecular volume of at least about 135, 140, 150, 155, 160, 165, 170, 175, 180, 185, 190, 195, or 200 Å$^3$. Alicyclic groups larger than about 220 or 250 Å$^3$ may be less preferred, in at least some applications. References herein to molecular volumes designate volumetric size as determined by standard computer modeling, which provides optimized chemical bond lengths and angles. A preferred computer program for determining molecular volume as referred to herein is Alchemy 2000, available from Tripos. For a further discussion of computer-based determination of molecular size, see T Omote et al, *Polymers for Advanced Technologies*, volume 4, pp. 277-287.

Particularly preferred tertiary alicyclic groups of photoacid-labile units include the following, where the wavy line depicts a bond to the carboxyl oxygen of the ester group, and R is suitably optionally substituted alkyl, particularly $C_{1-8}$ alkyl such as methyl, ethyl, etc.

First and second resins used in resists of the invention also may contain distinct photoacid-labile groups, i.e. the polymer may contain two or more ester groups that have distinct ester moiety substitutions e.g. one ester may have an alicyclic moiety and another ester may have an acyclic moiety such as t-butyl, or the polymer may contain both ester and other functional groups that are photoacid-labile such as acetals, ketals and/or ethers.

In any event, for use in positive-acting resists, polymers of the invention preferably comprise contain one or more repeat units that comprise a photoacid-labile group. In the case of the first resin, preferably the photoacid labile group(s) are a component of polymer units other than the hetero-substituted carbocyclic aryl groups.

As discussed above, preferred first and second resins of blends of the invention also may contain lactone units, such as lactones that are moieties of a polymerized acrylate, or other lactone polymerized from other unstaturated molecule. Polymer units containing alpha-butyrolactone groups are suitable.

As also discussed above, for first and second resins, also suitable are repeat units that comprise a cyano moiety, such as may be provided by polymerization of acrylonitrile or methacrylonitrile, or may be provided by other groups that have cyano substitution such as an acrylate group that comprises a cyano moiety particularly a cyanoadamantyl acrylate (where the cyano group is a substituent of the adamantyl ring).

Preferred first and second resins of blends of the invention may contain 2, 3, 4 or 5 distinct repeat units, i.e. preferred are copolymers, terpolymers, tetrapolymers and pentapolymers. Suitably, one of more of the resin repeat units comprise alicyclic groups as disclosed herein.

As discussed above, resins of blends of the invention are preferably employed in photoresists imaged at 193 nm and suitably will be at least substantially free of any phenyl or other aromatic groups other than the hetero-substituted carbocyclic aryl units. For example, such preferred resins that first and second resins will contain less than about 5 mole percent aromatic groups other than the hetero-substituted carbocyclic aryl units such as hydroxynaphthyl, more preferably less than about 2, 1 or 0.5 mole percent aromatic groups other than hetero-substituted carbocyclic aryl units such as hydroxynaphthyl groups.

First and second resins of blends of the invention may suitably vary in molecular weight and may e.g. have a weight average molecular weight (Mw) of about 800 or 1,000 to about 100,000, more preferably about 2,000 to about 30,000, still more preferably from about 2,000 to 15,000 or 20,000, with a molecular weight distribution (Mw/Mn) of about 3 or less, more preferably a molecular weight distribution of about 2 or less. Molecular weights (either Mw or Mn) of the polymers of the invention are suitably determined by gel permeation chromatography.

The relative amounts of the first and second resins in a blend or photoresist composition of the invention may suitably vary. For example, the first and second resins may be suitably present in relative weight rations of 10 to 90 to 90 to 10, more typically about 20 to 70 to about 70 to 30. also suitable will be weight rations of the first resin:second resin of 40:60 to 60:40. For at least certain resist formulations, it may be preferable to utilize the first resin in a weight excess relative to the second resin.

As mentioned above, various groups including resin units may be optionally substituted. Suitable optionally substituted groups may be substituted at one or more available positions by one or more suitable groups such as halogen (particularly F, Cl or Br); $C_{1-8}$ alkyl; $C_{1-8}$ alkoxy; $C_{2-8}$ alkenyl: $C_{2-8}$ alkenyl or alkynyl, aryl such as phenyl; alkanoyl such as a $C_{1-6}$ alkanoyl of acyl and the like; etc. Typically a substituted moiety is substituted at a total of one, two or three available positions.

Syntheses of Resins of Blends:

Resins of blends and resists of the invention can be prepared by a variety of methods. One suitable method is an addition reaction which may include free radical polymerization, e.g., by reaction of selected monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). Suitable reaction solvents include e.g. tetrahydrofuran or more suitably a halogenated solvent such as a fluorinated solvent or a chlorinated solvent and the like. Suitable reaction temperatures for any particular system can be readily determined empirically by those skilled in the art based on the present disclosure. A variety of free radical initiators may be employed. For example, azo compounds may be employed such as azo-bis-2,4-dimethylpentanenitrile. Peroxides, peresters, peracids and persulfates also could be employed.

Preferred resin syntheses are set forth in the examples which follows.

With respect to the first resin of a blend, hetero-substituted carbocyclic aryl units that have such vinyl substitution may be preferred reagents to form a first resin of the invention.

Other monomers that can be reacted to provide a polymer of the invention can be identified by those skilled in the art. For example, to provide photoacid-labile units, suitable monomers include e.g. methacrylate or acrylate that contains the appropriate group substitution (e.g. tertiary alicyclic, t-butyl, etc.) on the carboxy oxygen of the ester group. Suitable acrylate monomers with tertiary alicyclic groups for synthesis of polymers useful in the resists of the invention also are disclosed in U.S. Pat. No. 6,306,554 to Barclay et al. Maleic anhydride is a preferred reagent to provide fused anhydride polymer units. Vinyl lactones are also preferred reagents, such as alpha-butyrolactone.

Some suitable vinyl (endocyclic double bond) heterocyclic monomers that can be polymerized to provide both first and second resins of blends of the invention include the following:

Some particularly suitable groups to polymerize to form first resins of blends and photoresists of the invention include the following:

2-Methyl-acrylic acid
2-methyl-adamantan-2-yl ester (MAMA)

-continued

2-Methyl-acrylic acid
2-oxo-tetrahydro-furan-3-yl ester
(alpha-GBLMA)

6-Hydroxy-2-vinyl
napththalene (HVN)

2-Methyl-acrylic acid 5-cyano-bicyclo
[2.2.1]hept-2-yl ester (CNNMA)

Some particularly suitable groups to polymerize to form a second resins of blends and photoresists of the invention include the following:

2-Methyl-acrylic acid
2-methyl-adamantan-2-yl ester (MAMA)

-continued

2-Methyl-acrylic acid
2-oxo-tetrahydro-furan-3-yl ester
(alpha-GBLMA)

2-Methyl-acrylic acid 5-cyano-bicyclo
[2.2.1]hept-2-yl ester (CNNMA)

2-Methyl-acrylic acid 1-{4-[1-(2-methyl-acryloyloxy)-ethoxy]-
butoxy}-ethyl ester (BDADMA)

Photoresist Compositions:

Resin blends of the invention used in chemically-amplified positive-acting photoresist formulations preferably contain a sufficient amount of photogenerated acid labile groups to enable formation of resist relief images as desired. For instance, suitable amount of such acid labile groups will be at least 1 mole percent of total units of the polymer, more preferably about 2 to 7 mole percent, still more typically about 3 to 30, 40, 50 or 60 mole percent of total polymer units.

Photoresists of the invention in general comprise a photoactive component and a resin binder component that comprises a resin blend as described above.

The resin component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

wherein R is camphor, adamantane, alkyl (e.g. $C_{1-12}$ alkyl) and perfluoroalkyl such as perfluoro($C_{1-12}$ alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents for 193 nm and 248 nm imaging are the following PAGS 1 and 2:

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Also preferred is a triphenyl sulfonium PAG, complexed with anions such as the sulfonate anions mentioned above, particularly a perfluoroalkyl sulfonate such as perfluorobutane sulfonate.

Other known PAGS also may be employed in the resists of the invention. Particularly for 193 nm imaging, generally preferred are PAGS that do not contain aromatic groups, such as the above-mentioned imidosulfonates, in order to provide enhanced transparency.

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a lactate salt of tetrabutylammonium hydroxide as well as various other amines such as triisopropanol, diazabicyclo undecene or diazabicyclononene. The added base is suitably used in relatively small amounts, e.g. about 0.03 to 5 percent by weight relative to the total solids.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The resists of the invention can be readily prepared by those skilled in the art. For example, a photoresist composition of the invention can be prepared by dissolving the components of the photoresist in a suitable solvent such as, for example, 2-heptanone, cyclohexanone, ethyl lactate, ethylene glycol monomethyl ether, ethylene glycol monomethyl ether acetate, propylene glycol monomethyl ether; propylene glycol monomethyl ether acetate and 3-ethoxyethyl propionate. Typically, the solids content of the composition varies between about 5 and 35 percent by weight of the total weight of the photoresist composition. Resin and photoactive components should be present in amounts sufficient to provide a film coating layer and formation of good quality latent and relief images.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 mJ/cm$^2$, dependent upon the exposure tool and the components of the photoresist composition.

As discussed above, coating layers of the resist compositions of the invention are preferably photoactivated by a short exposure wavelength, particularly a sub-300 and sub-200 nm exposure wavelength. As discussed above, 193 nm is a particularly preferred exposure wavelength.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention.

General Comments:

In the following examples, the following monomers and polymer units are used and often referred to with the abbreviation designating the group as specified directly below the depicted unit. As would be understood, as incorporated into the polymer, the below units would be polymerized through the depicted carbon-carbon double bond.

2-Methyl-acrylic acid
2-methyl-adamantan-2-yl ester (MAMA)

2-Methyl-acrylic acid
2-oxo-tetrahydro-furan-3-yl ester
(alpha-GBLMA)

-continued

6-Hydroxy-2-vinyl
napthalene (HVN)

2-Methyl-acrylic acid 5-cyano-bicyclo
[2.2.1]hept-2-yl ester (CNNMA)

2-Methyl-acrylic acid 1-{4-[1-(2-methyl-acryloyloxy)-ethoxy]-butoxy}-
ethyl ester (BDADMA)

EXAMPLE 1

Synthesis of 6-Hydroxy-2-Vinylnaphthalene (HVN)

The synthesis of 6-hydroxy-2-vinylnaphthalene (HVN) was carried out by three step reactions starting from 6-hydroxy-2-naphthaldehyde. In the first step, 6-hydroxy-2-naphthaldeyde (HNAL) was protected with ethyl vinyl ether to give 6-(1-ethoxy ethoxy)-2-naphthaldehyde (EENAL). This was followed by the Wittig reaction of EENAL to yield 6-(1-ethoxy ethoxy)-2-vinylnaphthalene. Finally, this was deprotected using pyridinium p-toluenesulfonate to yield 6-hydroxy-2-vinylnaphthalene (HVN).

6-(1-Ethoxy ethoxy)-2-naphthaldehyde. In a 500 mL three neck flask, equipped with a magnetic stirrer, an addition funnel, and a reflux condenser, were charged 25 g of HNAL (0.1462 mol) and 300 mL of ethyl acetate. 6-Hydroxy-2-naphthaldeyde was not completely soluble even after 3 h stirring at room temperature. To this was added 3.30 g of PPTS (0.0131 mol) and the solution mixture was heated to 70° C. At this temperature, 21 g of ethyl vinyl ether (0.2912 mol) was added dropwise and the reaction mixture became homogeneous upon addition of a few drops of ethyl vinyl ether. After completion of ethyl vinyl ether addition, the reaction temperature was lowered to room temperature and the reaction mixture was stirred overnight. The crude product was purified by column chromatography (silica gel, $CH_2Cl_2$) to yield 26 g of pure 6-(1-ethoxy ethoxy)-2-naphthaldehyde (yield: 73%).

6-(1-Ethoxy ethoxy)-2-vinylnaphthalene. In a 1 L three neck flask, equipped with an overhead mechanical stirrer, was added 45 g of methyltriphenylphosphonium bromide (0.126 mol) under nitrogen atmosphere. To this were added anhydrous 300 mL of THF and 16.02 g of potassium tert-butoxide (0.1428 mol). After 1 h of stirring, 20 g of 6-(1-ethoxy ethoxy)-2-naphthaldehyde (0.0819 mol), dissolved in 50 mL of THF, was added dropwise using a cannular and the reaction mixture was stirred overnight. After overnight stirring, deionized water (200 mL) was added with a syringe and the phases were separated. The aqueous phase was extracted with ether (2×100 mL) and the combined extracts were dried over $MgSO_4$. After filtration and concentration, the crude product was purified by column chromatography (silica gel, hexane/$CH_2Cl_2$ 40/60~10/90) to yield 19.12 g of pure 6-(1-ethoxy ethoxy)-2-vinylnaphthalene (96%).

6-Hydroxy-2-vinylnaphthalene. 18 g of 6-(1-Ethoxy ethoxy)-2-vinylnaphthalene (0.0743 mol) was dissolved in 80 mL of ethanol. To this was added 1.6 g of pyridinium p-toluenesulfonate (0.0064 mol). The reaction mixture was stirred at 50° C. After 3 h, TLC analysis (silica, $CH_2Cl_2$) indicated that the reaction was over. The reaction mixture was cooled down to room temperature and the solvent was removed under reduced pressure. The crude product was purified by column chromatography (silica gel, $CH_2Cl_2$) to yield 11.15 g of pure 6-hydroxy-2-vinylnaphthalene (62%).

EXAMPLE 2

Synthesis of 2-Methyl-acrylic acid 1-{4-[1-(2-methyl-acryloyloxy)-ethoxy]-butoxy}-ethyl ester (BDADMA)

In a 1 L flask, 21.33 g of (4-vinyloxy-butoxy)-ethene (0.15 mol) and 34.44 g of methacrylic acid were mixed with 500 g of methylene chloride. To this was added 3.8 g of pyridinium p-toluenesulfonate (0.03 mol) and the reaction mixture was stirred at room temperature under nitrogen atmosphere. After 5 h stirring, the reaction mixture was washed with half-saturated brine twice and dried over $MgSO_4$. After evaporation of the solvent, the crude product was purified by column chromatography (silica gel, hexane/$CH_2Cl_2$ mixture) to yield 26 g of pure 2-methyl-acrylic acid 1-{4-[1-(2-methyl-acryloyloxy)-ethoxy]-butoxy}-ethyl ester (BDADMA) (yield: 73%).

EXAMPLE 3

Synthesis of MAMA/α-GBLMA/HVN 45/35/20 Terpolymer 10.60 g of 2-methyl-acrylic acid 2-methyl-adamantyl-2-yl ester (MAMA), 5.98 g of 2-methyl-acrylic acid 2-oxo-tetrahydro-furan-3-yl ester (α-GBLMA), and 3.42 g of 6-hydroxy-2-vinyl naphthalene (HVN) were dissolved in 20 g of tetrahydrofuran (THF). The mixture was degassed by bubbling with nitrogen for 20 min. 1.16 g of V601 (dimethyl-2,2-azodiisobutyrate) was dissolved in 10 g of THF and charged into a 150 mL flask, equipped with a nitrogen inlet and a condenser. After degassing by bubbling with nitrogen for 20 min, the reactor containing V601 solution was placed in an oil bath kept at 75° C. and the monomer solution was fed into the reactor at a rate of 0.222 mL/min. The monomer feeding was carried out for 3 hours. After monomer feeding was complete, the polymerization mixture was stirred for additional 1 hour at 75° C. After a total of 4 hour polymerization time (3 hour feeding and 1 hour stirring), the polymerization mixture was cooled down to room temperature. Precipitation was carried out in a 1 L of isopropyl alcohol. After filtration, the polymer was dried in a vacuum oven at 50° C. for 48 hours to give 16.4 g of the copolymer (Mw=14,300 and Mw/Mn=1.8).

EXAMPLE 4

Synthesis of MAMA/α-GBLMA/HVN 45/40/15 Terpolymer 10.60 g of MAMA, 6.84 g of α-GBLMA, and 2.57 g of HVN were dissolved in 20 g of THF. The mixture was degassed by bubbling with nitrogen for 20 min. 1.16 g of V601 (dimethyl-2,2-azodiisobutyrate) was dissolved in 10 g of THF and charged into a 150 mL flask, equipped with a nitrogen inlet and a condenser. After degassing by bubbling with nitrogen for 20 min, the reactor containing V601 solution was placed in an oil bath kept at 75° C. and the monomer solution was fed into the reactor at a rate of 0.222 mL/min. The monomer feeding was carried out for 3 hours. After monomer feeding was complete, the polymerization mixture was stirred for additional 1 hour at 75° C. After a total of 4 hour polymerization time (3 hour feeding and 1 hour stirring), the polymerization mixture was cooled down to room temperature. Precipitation was carried out in a 1 L of isopropyl alcohol. After filtration, the polymer was dried in a vacuum oven at 50° C. for 48 hours to give 16.1 g of the copolymer (Mw=14,250 and Mw/Mn=1.9).

EXAMPLE 5

Synthesis of MAMA/α-GBLMA/HVN 45/45/10 Terpolymer 10.60 g of MAMA, 7.69 g of α-GBLMA, and 1.71 g of HVN were dissolved in 20 g of THF. The mixture was degassed by bubbling with nitrogen for 20 min. 1.16 g of V601 (dimethyl-2,2-azodiisobutyrate) was dissolved in 10 g of THF and charged into a 150 mL flask, equipped with a nitrogen inlet and a condenser. After degassing by bubbling with nitrogen for 20 min, the reactor containing V601 solution was placed in an oil bath kept at 75° C. and the monomer solution was fed into the reactor at a rate of 0.222 mL/min. The monomer feeding was carried out for 3 hours. After monomer feeding was complete, the polymerization mixture was stirred for additional 1 hour at 75° C. After a total of 4 hour polymerization time (3 hour feeding and 1 hour stirring), the polymerization mixture was cooled down to room temperature. Precipitation was carried out in a 1 L of isopropyl alcohol. After filtration, the polymer was dried in a vacuum oven at 50° C. for 48 hours to give 16.9 g of the copolymer (Mw=14,040 and Mw/Mn=1.8).

EXAMPLE 6

Synthesis of MAMA/α-GBLMA/HVN 40/45/15 Terpolymer 9.57 g of MAMA, 7.82 g of α-GBLMA, and 2.61 g of HVN were dissolved in 20 g of THF. The mixture was degassed by bubbling with nitrogen for 20 min. 1.18 g of V601 (dimethyl-2,2-azodiisobutyrate) was dissolved in 10 g of THF and charged into a 150 mL flask, equipped with a nitrogen inlet and a condenser. After degassing by bubbling with nitrogen for 20 min, the reactor containing V601 solution was placed in an oil bath kept at 75° C. and the monomer solution was fed into the reactor at a rate of 0.222 mL/min. The monomer feeding was carried out for 3 hours. After monomer feeding was complete, the polymerization mixture was stirred for additional 1 hour at 75° C. After a total of 4 hour polymerization time (3 hour feeding and 1 hour stirring), the polymerization mixture was cooled down to room temperature.

Precipitation was carried out in a 1 L of isopropyl alcohol. After filtration, the polymer was dried in a vacuum oven at 50° C. for 48 hours to give 16.6 g of the copolymer (Mw=13,590 and Mw/Mn=1.8).

EXAMPLE 7

Synthesis of MAMA/α-GBLMA/HVN 40/50/10 Terpolymer 9.57 g of MAMA, 8.69 g of α-GBLMA, and 1.74 g of HVN were dissolved in 20 g of THF. The mixture was degassed by bubbling with nitrogen for 20 min. 1.18 g of V601 (dimethyl-2,2-azodiisobutyrate) was dissolved in 10 g of THF and charged into a 150 mL flask, equipped with a nitrogen inlet and a condenser. After degassing by bubbling with nitrogen for 20 min, the reactor containing V601 solution was placed in an oil bath kept at 75° C. and the monomer solution was fed into the reactor at a rate of 0.222 mL/min. The monomer feeding was carried out for 3 hours. After monomer feeding was complete, the polymerization mixture was stirred for additional 1 hour at 75° C. After a total of 4 hour polymerization time (3 hour feeding and 1 hour stirring), the polymerization mixture was cooled down to room temperature. Precipitation was carried out in a 1 L of isopropyl alcohol. After filtration, the polymer was dried in a vacuum oven at 50° C. for 48 hours to give 16.1 g of the copolymer (Mw=13,120 and Mw/Mn=1.8).

EXAMPLE 8

Synthesis of MAMA/α-GBLMA/HVN 35/45/20 Terpolymer 8.51 g of MAMA, 7.95 g of α-GBLMA, and 3.53 g of HVN were dissolved in 20 g of THF. The mixture was degassed by bubbling with nitrogen for 20 min. 1.20 g of V601 (dimethyl-2,2-azodiisobutyrate) was dissolved in 10 g of THF and charged into a 150 mL flask, equipped with a nitrogen inlet and a condenser. After degassing by bubbling with nitrogen for 20 min, the reactor containing V601 solution was placed in an oil bath kept at 75° C. and the monomer solution was fed into the reactor at a rate of 0.222 mL/min. The monomer feeding was carried out for 3 hours. After monomer feeding was complete, the polymerization mixture was stirred for additional 1 hour at 75° C. After a total of 4 hour polymerization time (3 hour feeding and 1 hour stirring), the polymerization mixture was cooled down to room temperature. Precipitation was carried out in a 1 L of isopropyl alcohol. After filtration, the polymer was dried in a vacuum oven at 50° C. for 48 hours to give 17.4 g of the copolymer (Mw=14,540 and Mw/Mn=1.9).

EXAMPLE 9

Synthesis of MAMA/α-GBLMA/HVN 35/50/15 Terpolymer 8.51 g of MAMA, 8.83 g of α-GBLMA, and 2.65 g of HVN were dissolved in 20 g of THF. The mixture was degassed by bubbling with nitrogen for 20 min. 1.20 g of V601 (dimethyl-2,2-azodiisobutyrate) was dissolved in 10 g of THF and charged into a 150 mL flask, equipped with a nitrogen inlet and a condenser. After degassing by bubbling with nitrogen for 20 min, the reactor containing V601 solution was placed in an oil bath kept at 75° C. and the monomer solution was fed into the reactor at a rate of 0.222 mL/min. The monomer feeding was carried out for 3 hours. After monomer feeding was complete, the polymerization mixture was stirred for additional 1 hour at 75° C. After a total of 4 hour polymerization time (3 hour feeding and 1 hour stirring), the polymerization mixture was cooled down to room temperature. Precipitation was carried out in a 1 L of isopropyl alcohol. After filtration, the polymer was dried in a vacuum oven at 50° C. for 48 hours to give 15.9 g of the copolymer (Mw=14,040 and Mw/Mn=1.9).

EXAMPLE 10

Synthesis of MAMA/α-GBLMA/HVN 35/55/10 Terpolymer 8.51 g of MAMA, 9.72 g of α-GBLMA, and 1.77 g of HVN were dissolved in 20 g of THF. The mixture was degassed by bubbling with nitrogen for 20 min. 1.20 g of V601 (dimethyl-2,2-azodiisobutyrate) was dissolved in 10 g of THF and charged into a 150 mL flask, equipped with a nitrogen inlet and a condenser. After degassing by bubbling with nitrogen for 20 min, the reactor containing V601 solution was placed in an oil bath kept at 75° C. and the monomer solution was fed into the reactor at a rate of 0.222 mL/min. The monomer feeding was carried out for 3 hours. After monomer feeding was complete, the polymerization mixture was stirred for additional 1 hour at 75° C. After a total of 4 hour polymerization time (3 hour feeding and 1 hour stirring), the polymerization mixture was cooled down to room temperature. Precipitation was carried out in a 1 L of isopropyl alcohol. After filtration, the polymer was dried in a vacuum oven at 50° C. for 48 hours to give 16.0 g of the copolymer (Mw=13,990 and Mw/Mn=1.9).

EXAMPLE 11

Synthesis of MAMA/α-GBLMA/CNNMA/BDADMA 40/40/10/10 Terpolymer 17.54 g of MAMA, 12.74 g of α-GBLMA, 3.84 g of 2-methyl-acrylic acid 5-cyano-bicyclo [2.2.1]hept-2-yl ester (CNNMA), and 5.88 g of 2-methyl-acrylic acid 1-{4-1-(2-methyl-acyloyloxy)-ethoxy]-butoxy}-ethyl ester (BDADMA) were dissolved in 40 g of THF. The mixture was degassed by bubbling with nitrogen for 20 min. 3.02 g of V601 (dimethyl-2,2-azodiisobutyrate) was dissolved in 20 g of THF and charged into a 250 mL flask, equipped with a nitrogen inlet and a condenser. After degassing by bubbling with nitrogen for 20 min, the reactor containing V601 solution was placed in an oil bath kept at 75° C. and the monomer solution was fed into the reactor at a rate of 0.444 mL/min. The monomer feeding was carried out for 3 hours. After monomer feeding was complete, the polymerization mixture was stirred for additional 1 hour at 75° C. After a total of 4 hour polymerization time (3 hour feeding and 1 hour stirring), the polymerization mixture was cooled down to room temperature. Precipitation was carried out in a 1 L of isopropyl alcohol. After filtration, the polymer was dried in a vacuum oven at 50° C. for 48 hours to give 33.4 g of the copolymer (Mw=10,990 and Mw/Mn=2.1).

EXAMPLE 12

Synthesis of MAMA/α-GBLMA/CNNMA/BDADMA 36/36/18/10 Terpolymer 15.77 g of MAMA, 11.45 g of α-GBLMA, 6.90 g of CNNMA, and 5.88 g of BDADMA were dissolved in 40 g of THF. The mixture was degassed by bubbling with nitrogen for 20 min. 3.01 g of V601 (dimethyl-2,2-azodiisobutyrate) was dissolved in 20 g of THF and charged into a 250 mL flask, equipped with a nitrogen inlet and a condenser. After degassing by bubbling with nitrogen for 20 min, the reactor containing V601 solution was placed in an oil bath kept at 75° C. and the monomer solution was fed into the reactor at a rate of 0.444 mL/min. The monomer feeding was carried out for 3 hours. After monomer feeding was complete, the polymerization mixture was stirred for additional 1 hour at 75° C. After a total of 4 hour polymerization time (3 hour feeding and 1 hour stirring), the polymerization mixture was cooled down to room temperature. Precipitation was carried out in a 1 L of isopropyl alcohol. After filtration, the polymer was dried in a vacuum oven at 50° C. for 48 hours to give 33.4 g of the copolymer (Mw=10,720 and Mw/Mn=2.0).

EXAMPLE 13

Synthesis of MAMA/α-GBLMA/CNNMA/BDADMA 32/32/26/10 Terpolymer 14.00 g of MAMA, 10.17 g of α-GBLMA, 9.96 g of CNNMA, and 5.87 g of BDADMA were dissolved in 40 g of THF. The mixture was degassed by bubbling with nitrogen for 20 min. 3.01 g of V601 (dimethyl-2,2-azodiisobutyrate) was dissolved in 20 g of THF and charged into a 250 mL flask, equipped with a nitrogen inlet and a condenser. After degassing by bubbling with nitrogen for 20 min, the reactor containing V601 solution was placed in an oil bath kept at 75° C. and the monomer solution was fed into the reactor at a rate of 0.444 mL/min. The monomer feeding was carried out for 3 hours. After monomer feeding was complete, the polymerization mixture was stirred for additional 1 hour at 75° C. After a total of 4 hour polymerization time (3 hour feeding and 1 hour stirring), the polymerization mixture was cooled down to room temperature. Precipitation was carried out in a 1 L of isopropyl alcohol. After filtration, the polymer was dried in a vacuum oven at 50° C. for 48 hours to give 33.4 g of the copolymer (Mw=10,800 and Mw/Mn=2.1).

EXAMPLE 14

Synthesis of HVN/MADA/NLA Terpolymer (Polymer Consisting of Polymerized Units of: 6-hydroxy-2-vinylnaphthalene (HVN); 2-methyl-2-adamantyl acrylate (MADA); and acryloxy-norbornane-butyrolactone (NLA))

1.66 g of HVN, 4.29 g of 2-methyl-2-adamantyl acrylate (MADA), 4.05 g of acryloxy-norbornane-butyrolactone (NLA), and 0.2242 g of V601 (dimethyl-2,2-azodiisobutyrate) were dissolved in 30 mL of THF. This mixture was degassed by bubbling with nitrogen for 20 min and then placed in an oil bath kept at 75° C. to start polymerization. After polymerization for 12 h, the polymerization mixture was precipitated into hexane/isopropanol 80/20 v/v mixture. Second precipitation was carried out in hexane/isopropanol 50/50 v/v mixture. After filtration, a slight yellowish powder was obtained and this was dried in a vacuum oven at 50° C. overnight to yield 9 g of HVN/MADA/NLA terpolymer (90% yield).

Other copolymers were prepared using a similar procedure and results are summarized below. MVN is 2-vinyl-6-methoxynaphthalene. EEMA is 1-ethoxy ethyl methacrylate. EEA is 1-ethoxy ethyl acrylate.

| Copolymer | Composition | Yield | Mw | Mw/Mn | OD at 193 nm |
| --- | --- | --- | --- | --- | --- |
| VN/EEMA | 60/40 | 62% | 9,160 | 1.39 | 3.8 |
| MVN/EEMA | 60/40 | 76% | 12,114 | 1.62 | — |
| HVN/EEMA | 60/40 | 73% | 15,085 | 1.61 | 3.2 |
| HVN/EEA | 60/40 | 90% | 19,900 | 2.03 | — |
| HVN/NLA/MADA | 20/40/40 | 90% | 16,200 | 3.64 | 1.1 |

EXAMPLE 15

A copolymer of 2-vinylnaphthalene (VN) and 1-ethoxy ethyl methacrylate (EEMA) with 60 mol % of VN was prepared. This copolymer was spin-coated on a Si wafer, etched under oxide etch conditions ($C_4F_8$/Ar/CO/$O_2$; 1500 W; 45 mT) for 60 sec, and then surface roughness was measured using atomic force microscopy (AFM). This copolymer exhibited the rms roughness (Rq) of 5.46 mm.

A further group of polymers were then prepared of the following components and surface roughness examined after etching under oxide etch conditions.

VN/EEMA: $R_1$ = H and $R_2$ = $CH_3$
MVN/EEMA: $R_1$ = $OCH_3$ and $R_2$ = $CH_3$
HVN/EEMA: $R_1$ = OH and $R_2$ = $CH_3$
HVN/EEA: $R_1$ = and $R_2$ = H

EXAMPLE 16

Photoresist Preparation and Lithographic Processing

A photoresist composition of the invention was prepared by admixing the following components in the following amounts where amounts are expressed as weight percent of solids (all components except solvent) where the photoresist composition is formulated at 8.2 weight percent solids (balance being ethyl lactate solvent).

The formulated resist composition is spin coated onto silicon wafers over a crosslinked organic antireflective layer and the applied photoresist layer is softbaked via a vacuum hotplate at 110° C. for 90 seconds to provide a dried layer thickness of 210 nm. The resist coating layer is exposed through a photomask at 193 nm at 34.0 mJ/cm$^2$ dose (Exposure: ASML/1100; Illumination: 0.75 NA, 085/0.55σ Annular; Mask: 6% ATTPSM, 90 nm 1:1 L/S (BF) and Trench (DF)). The exposed coating layers are post-exposure baked at 110° C. for 90 seconds. The imaged resist layer is then developed by treatment with an aqueous tetramethylammonium hydroxide solution.

Figure 1A:
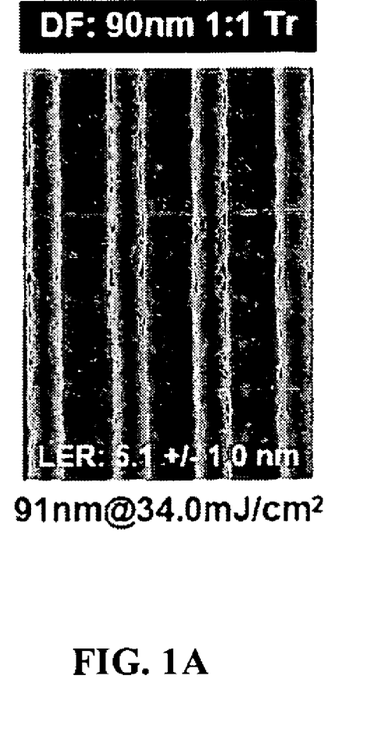
FIGS. 1A and 1B show Scanning Electron Micrograph (SEM) of developed photoresist images of Example 16 which follow.
Figure 1B:
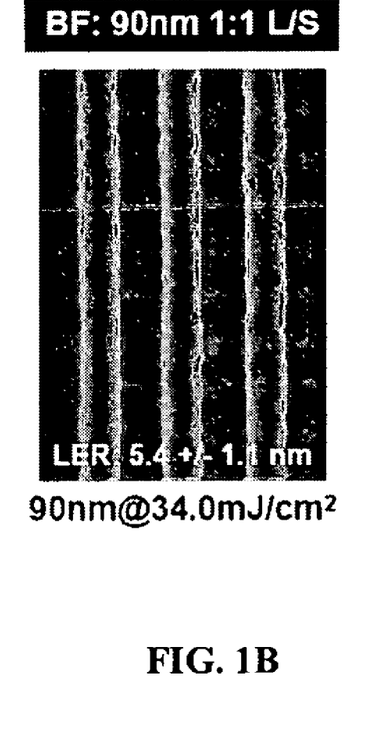

FIG. 1A and FIG. 1B of the drawings show scanning electron micrographs of the developed images (lines having 90 nm width). Line edge roughness of the developed lines were excellent as shown in the figures.

The foregoing description of the invention is merely illustrative thereof, and it is understood that variations and modifications can be effected without departing from the spirit or scope of the invention as set forth in the following claims.

What is claimed is:

1. A positive photoresist composition comprising:
   1) a photoactive component; and
   2) a resin component comprising i) a first resin that comprises hydroxy naphthyl groups and ii) a second resin distinct from the first resin and that comprises crosslinked groups,
   wherein the first and second resins are substantially free of aromatic groups other than the hydroxy naphthyl groups.

2. The photoresist composition of claim 1 wherein one or both of the first and second resins comprise polymerized acrylate units.

3. The photoresist composition of claim 1 wherein one but not both of the first and second resins comprise polymerized acrylate units.

4. The photoresist composition of claim 1 wherein both of the first and second resins comprise polymerized acrylate units.

5. The photoresist of claim 1 wherein one but not both of the first and second resins comprises photoacid-labile groups.

6. The photoresist of claim 1 wherein both of the first and second resins comprises photoacid-labile groups.

7. A method for providing a photoresist relief image, comprising:
   a) applying a coating layer of a photoresist composition of claim 1 on a substrate; and
   b) exposing the photoresist composition layer to radiation and developing the exposed photoresist composition coating layer.

8. A positive photoresist composition comprising:
   1) a photoactive component and
   2) a resin component comprising i) a first resin that comprises hydroxy naphthyl groups
   and ii) a second resin distinct from the first resin and that comprises crosslinked groups,
   wherein one or both of the first and second resins comprise polymerized acrylate units.

9. The photoresist composition of claim 8 wherein the first and second resins are substantially free of aromatic groups other than the hydroxy naphthyl groups.

10. The photoresist composition of claim 8 wherein one of the first and second resins comprise polymerized acrylate units.

11. The photoresist composition of claim 8 wherein both of the first and second resins comprise polymerized acrylate units.

12. A method for providing a photoresist relief image, comprising:

a) applying a coating layer of a photoresist composition of claim 8 on a substrate; and b) exposing the photoresist composition layer to radiation and developing the exposed photoresist composition coating layer.

13. A microelectronic wafer substrate comprising a photoresist composition of claim 1.

14. A microelectronic wafer substrate comprising a photoresist composition of claim 2.

15. A microelectronic wafer substrate comprising a photoresist composition of claim 8.

* * * * *